United States Patent [19]
Okada et al.

[11] 3,986,048
[45] Oct. 12, 1976

[54] NON-LINEAR AMPLIFIER
[75] Inventors: Takashi Okada, Yamato; Kimitake Utsunomiya, Tokyo, both of Japan
[73] Assignee: Sony Corporation, Tokyo, Japan
[22] Filed: June 18, 1975
[21] Appl. No.: 587,847

Related U.S. Application Data
[62] Division of Ser. No. 492,838, July 29, 1974, Pat. No. 3,935,478.

[30] Foreign Application Priority Data
Aug. 10, 1973 Japan.............................. 48-90150
Aug. 10, 1973 Japan.............................. 48-90151

[52] U.S. Cl.............................. 307/229; 328/144
[51] Int. Cl.² .......................................... G06G 7/20
[58] Field of Search .................. 330/22, 24, 23, 32, 330/38 M, 40; 307/229, 230; 328/142, 144, 145; 235/150.53, 193.5, 197

[56] References Cited
UNITED STATES PATENTS
3,689,752  9/1972  Gilbert........................... 307/229 X Primary Examiner—James B. Mullins
Attorney, Agent, or Firm—Lewis H. Eslinger; Alvin Sinderbrand

[57] ABSTRACT

A non-linear amplifier is disclosed including an amplifying transistor for amplifying an input signal, an output amplified signal being derived from the amplifying transistor. A series of PN junctions is provided to supply a determined bias voltage to the amplifying transistor. An emitter-follower stage, comprised of at least one emitter-follower transistor amplifier, is connected to an input of the amplifying transistor for compensating the bias voltage applied thereto. In one embodiment, the input signal is amplified by a power of n wherein n PN junctions are connected in parallel with (n–1) emitter-follower transistor amplifiers. The input signal is supplied through the (n–1) emitter-followers to the base electrode of the amplifying transistor. In an alternative embodiment, the input signal is amplified by a power of 1/n wherein (n–1) PN junctions are coupled to the emitter electrode of the amplifying transistor and (n–1) emitter-follower transistors are connected in cascade to the base electrode of the amplifying transistor. In this latter embodiment, an output transistor is connected to the output of the emitter-follower stage.

4 Claims, 6 Drawing Figures

NON-LINEAR AMPLIFIER

This is a division of application Ser. No. 492,838, filed July 29, 1974, and now issued as U.S. Pat. No. 3,935,478.

BACKGROUND OF THE INVENTION

This invention relates to a non-linear amplifier and, more particularly, to a transistorized non-linear amplifier wherein the input signal is amplified by a power of $n$ or by a power of $1/n$, wherein $n$ is a positive integer greater than 1.

Transistorized non-linear amplifiers are known wherein the amplification factor admits of an exponential characteristic. That is, the amplified output signal is exponentially related to the input signal. Such prior art non-linear amplifiers generally consist of an amplifying transistor having a base electrode to which the input signal is applied and a collector electrode from which the amplified signal is derived. Additionally, a first series of PN junctions are connected between the amplifying transistor base electrode and a reference potential, and a second series of PN junctions are provided to connect the amplifying transistor emitter electrode to such reference potential.

Although the various operating characteristics of the PN junction devices as well as the amplifying transistor can be selected to be substantially equal, an attendant disadvantage of such prior art non-linear amplifiers is that the output amplified signal and, in particular, the output current is temperature dependent. Stated otherwise, the output current includes a component that is sensitive to changes in temperature. Consequently, the amplification attained by such non-linear amplifier can not be maintained constant throughout a range of temperature variations, resulting in deleterious affects.

OBJECTS OF THE INVENTION

Therefore, it is an object of the present invention to provide a non-linear amplifier having an amplification factor that is independent of temperature variations.

It is another object of the present invention to provide an improved non-linear amplifier wherein an input signal is amplified by a power of $n$.

Another object of this invention is to provide an improved non-linear amplifier wherein an input signal is amplified by a power of $1/n$.

A still further object of the present invention is to provide an improved non-linear amplifier that is temperature stable and that is readily adapted to be constructed in integrated circuit configuration.

A still further object of the present invention is to provide an improved non-linear amplifier wherein an output signal is related to an input signal by a power of $n$ or by a power of $1/n$ regardless of variations in temperature.

Various other objects and advantages of the present invention will become clear from the ensuing detailed description of certain preferred embodiments, and the novel features will be particularly pointed out in the appended claims.

SUMMARY OF THE INVENTION

In accordance with the present invention a non-linear amplifier is comprised of an amplifying transistor for receiving an input signal and for producing an amplified output signal; a series of PN junctions for producing a predetermined bias voltage to be supplied to the amplifying transistor; and an emitter-follower stage including at least one emitter-follower transistor connected to the input of the amplifying transistor. In one embodiment wherein the input signal is amplified by a factor of $n$, the input signal is supplied through the emitter-follower stage to the input of the amplifying transistor and the series of PN junctions is connected to the emitter-follower stage to produce the bias voltage thereat. In another embodiment wherein the input signal is amplified by a power of $1/n$, the series of PN junctions is connected in the base-emitter circuit of the amplifying transistor to provide the bias voltage thereat and the emitter-follower stage is connected substantially in parallel with the base-emitter circuit of the amplifying transistor.

BRIEF DESCRIPTION OF THE DRAWINGS

The following detailed description will best be understood in conjunction with the accompanying drawings wherein.

DETAILED DESCRIPTION OF CERTAIN OF THE PREFERRED EMBODIMENTS

Figure 1:
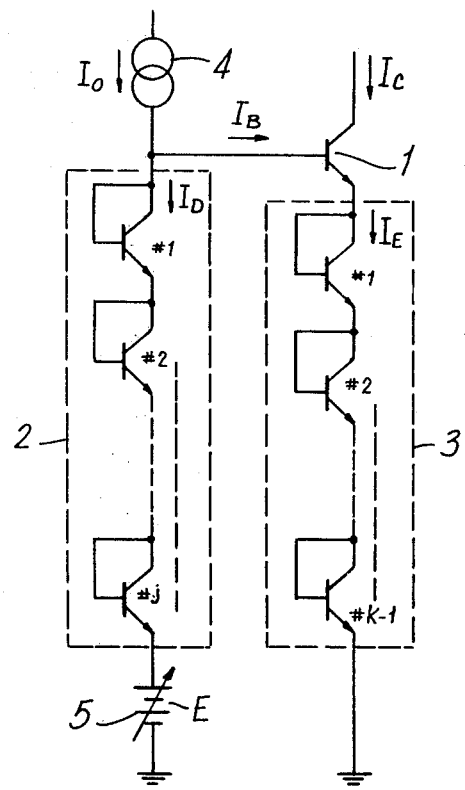
FIG. 1 is a schematic representation of a typical prior art non-linear amplifier.

Referring now to the drawings, wherein like reference numerals are used throughout, and in particular to FIG. 1, there is schematically illustrated a representation of a typical prior art non-linear amplifier. This non-linear amplifier is comprised of an amplifying transistor 1, a first series of P-N junctions 2 and a second series of P-N junctions 3. The amplifying transistor 1 includes a base electrode adapted to receive an input signal applied thereto by a constant current source 4 of conventional design. The base electrode of the amplifying transistor is further connected through a series of P-N junctions 2 to a reference voltage source 5. The series of P-N junctions is here formed of $j$ diode-connected transistors wherein each such transistor includes a base electrode connected directly to its collector electrode.

The emitter electrode of the amplifying transistor 1 is connected through the series 3 of P-N junctions to a reference potential, such as ground. The series 3 of P-N junctions is formed of $(k-l)$ diode-connected transistors, similar to the diode-connected transistors of series 2. The operating characteristics of the $j$ diode-connected transistors included in the series 2 as well as the operating characteristics of the $(k-l)$ diode-connected transistors in the series 3 and the amplifying transistor 1 are selected to be substantially equal. The output amplified signal produced by the illustrated non-linear amplifier is derived from the collector electrode of the amplifying transistor 1.

The operation of the prior art non-linear amplifier, as illustrated in FIG. 1, will now be mathematically described. Let it be assumed that the voltage drop across each P-N junction of the series 2, i.e., the base-emitter voltage drop across each diode-connected transistor, is equal to $V_1$. Let it further be assumed that the voltage drop across the base-emitter junction of the amplifying transistor 1 as well as the voltage drop across each P-N junction included in the series 3 is equal to $V_2$. Now, if the voltage produced by the reference voltage source 5 is $E$, then the voltage at the base electrode of the amplifying transistor 1 can be expressed as follows:

$$j \cdot V_1 + E = kV_2 \quad (1)$$

It is appreciated that the base current $I_B$ flowing through the amplifying transistor 1 is negligible when compared with the input signal current $I_o$, supplied by the constant current source 4, the current $I_D$ flowing through the series 2 of P-N junctions, the current $I_E$ flowing through the series 3 of P-N junctions and the output current $I_C$ flowing in the collector circuit of the amplifying transistor 1. Consequently, the base current $I_B$ can be omitted to derive the following valid relationships between the respective currents:

$$I_o \approx I_D = I_{S1} \cdot e^{q/kT \, V_1} = I_{s1} e^{\alpha V_1} \quad (2)$$

$$I_C \approx I_E = I_{S2} \cdot e^{q/kT \, V_2} = I_{s2} e^{\alpha V_2} \quad (3)$$

wherein $I_{S1}$ and $I_{S2}$ are the input current coefficients of the respective P-N junctions in the series 2 and 3 (i.e., the input coefficients of the respective diode-connected transistors), $q$ is the charge of an electron, $k$ is the Boltzmann's constant, $T$ is the absolute temperature in degrees Kelvin and $\alpha$ is equal to $q/kT$.

Solving for the voltages $V_1$ and $V_2$, the equations (2) and (3) may be rewritten as follows:

$$V_1 = \frac{1}{\alpha} \cdot \ln \frac{I_o}{I_{S1}} \quad (4)$$

$$V_2 = \frac{1}{\alpha} \cdot \ln \frac{I_C}{I_{S2}} \quad (5)$$

The voltages $V_1$ and $V_2$, as expressed in equations (4) and (5) can now be substituted into equation (1) to obtain a mathematical expression for the output current $I_C$ as follows:

$$I_C = \frac{I_{S2}}{I_{S1}^{j/k}} \cdot e^{\alpha E/k} \cdot I_o^{j/k} \quad (6)$$

As is apparent, the output current $I_C$ is proportional to the input current $I_o$ by a power of $j/k$. That is, the non-linear amplifier illustrated in FIG. 1 is capable of amplifying the input current by a power of $j/k$. It is appreciated that both $j$ and $k$ can be selected to any desired amount. Accordingly, merely by selecting the number of P-N junctions included in each series, the power of amplification can be an integer wherein $j/k$ is equal to $n$ or, as an alternative, the amplification power $j/k$ can be selected as $1/n$.

An examination of equation (6) above indicates that the output current $I_C$ includes the factor $e^{\alpha E/k}$ which means that the output current is dependent upon the temperature T. Thus, the prior art non-linear amplifier is undesirably temperature dependent whereby the output current $I_C$ is deleteriously effected by variations in temperature.

Figure 2:
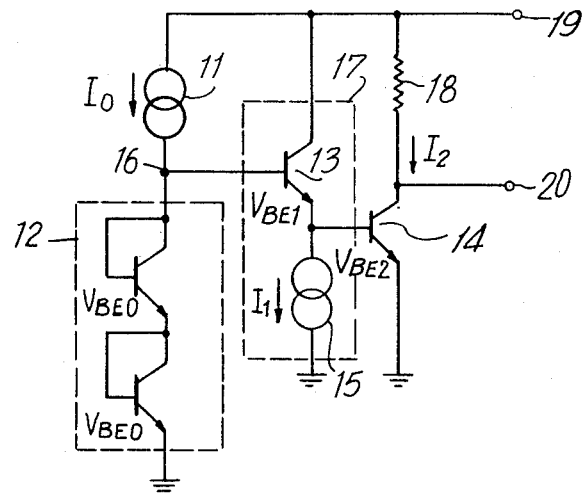
FIG. 2 is a schematic representation of a specific non-linear amplifier in accordance with the teachings of the present invention.

The present invention overcomes the problem of temperature-sensitive characteristics of a non-linear amplifier as will now be seen. A simplified schematic illustration of one embodiment of a non-linear transistor amplifier in accordance with the present invention is illustrated in FIG. 2 wherein the input signal is amplified by a power of 2. As there illustrated, the simplified non-linear transistor amplifier is comprised of an amplifying transistor 14, a series of P-N junctions 12 and an emitter-follower stage 17. The amplifying transistor 14 is adapted to receive an input signal to be amplified, the input signal being supplied by an input current source 11 coupled to a junction 16. The emitter-follower stage 17 is interconnected between the junction 16 and the base electrode of the amplifying transistor 14 so as to supply the input signal to the amplifying transistor. In this simplified circuit embodiment, the emitter-follower stage 17 is comprised of a transistor 13 having a constant current source 15 connected in its emitter circuit. The emitter-follower transistor 13 is connected to a source of energizing potential 19.

The series of P-N junctions 12 is comprised of two junctions connected in series between the junction 16 and a reference potential, such as ground. In the illustrated embodiment, each of the P-N junctions is formed of a diode-connected transistor wherein the base and collector electrodes thereof are interconnected. The series of P-N junctions is adapted to provide a bias voltage for the amplifying transistor 14, which bias voltage is compensated by the emitter-follower stage.

The amplifying transistor 14 is disposed in the common-emitter configuration whereby the amplified signal is derived at the collector electrode and is supplied to an output terminal 20. As seen, the collector electrode of the amplifying transistor is connected to the source of energizing potential 19 by a load resistor 18.

The operating characteristics of the amplifying transistor 14, the emitter-follower transistor 13 and the diode-connected transistors included in the series of P-N junctions 12 are substantially the same. It is appreciated that such matched operating characteristics are readily obtained in accordance with conventional integrated circuit technology. Therefore, preferably, the illustrated non-linear amplifier is constructed as an integrated circuit wherein the various transistor components exhibit substantially the same operating characteristics.

The operation of the illustrated non-linear amplifier will now be described. Let it be assumed that the voltage drop across each of the P-N junctions included in the series 12 is designated as $V_{BE0}$. It is appreciated that if each P-N junction is formed of a diode-connected transistor, the voltage drop thereacross is equal to the base-emitter forward voltage drop across such transistor. Let it also be assumed that the base-emitter voltage drop across the emitter-follower transistor 13 included in the emitter-follower stage 17 is designated as $V_{BE1}$ and that the base-emitter voltage drop across the amplifying transistor 14 is designated as $V_{BE2}$. When the voltage at junction 16 is considered, the following relation obtains:

$$2V_{BE0} = V_{BE1} + V_{BE2} \tag{7}$$

If the current amplification coefficient $h_{FE}$ of each of the amplifying transistor 14 and the emitter-follower transistor 13 is selected to be relatively large, it is appreciated that the base currents flowing in these respective transistors are negligible and, for the purpose of the instant discussion, can be neglected. Accordingly, the input signal current $I_0$ obtained from the input current source 11, the emitter-follower stage current $I_1$ obtained from the constant current source 15 and the output current $I_2$ of the amplifying transistor 14 can be mathematically expressed as:

$$I_0 \approx I_S \cdot e^{q/kT\ V_{BE0}} = I_S \cdot e^{\alpha V_{BE0}} \tag{8}$$

$$I_1 \approx I_S \cdot e^{q/kT\ V_{BE1}} = I_S \cdot e^{\alpha V_{BE1}} \tag{9}$$

$$I_2 \approx I_S \cdot e^{q/kT\ V_{BE2}} = I_S \cdot e^{\alpha V_{BE2}} \tag{10}$$

wherein $I_S$ represents an input current coefficient of the respective transistors and which is seen to be substantially the same for all of the transistors in view of the assumed identity of operating characteristics.

From equations (8), (9) and (10) the respective base-emitter voltage drops are derived as:

$$V_{BE0} = \frac{1}{\alpha} \ln \frac{I_0}{I_S} \tag{11}$$

$$V_{BE1} = \frac{1}{\alpha} \ln \frac{I_1}{I_S} \tag{12}$$

$$V_{BE2} = \frac{1}{\alpha} \ln \frac{I_2}{I_S} \tag{13}$$

Equations (11), (12) and (13) can be inserted into equation (7) above to obtain the following:

$$2 \frac{1}{\alpha} \ln \frac{I_0}{I_S} = \frac{1}{\alpha} \ln \frac{I_1}{I_S} + \frac{1}{\alpha} \ln \frac{I_2}{I_S} \tag{13A}$$

From equation (13A) the output current $I_2$ can be mathematically expressed as:

$$I_2 = \frac{1}{I_1} \cdot I_0^2 \tag{14}$$

It is appreciated that the term $I_1$ is the current flowing through the emitter-follower stage 17 and is a constant current derived from the current source 15. Hence, the factor $1/I_1$ is a constant factor. It is thus seen that the output current is proportional to the input current amplified by a power of 2. Accordingly, the non-linear amplifier circuit schematically illustrated in FIG. 2 operates as a 2-nd power non-linear amplifier.

An embodiment of a general $n$-th power non-linear amplifier in accordance with the present invention will now be described with reference to FIG. 3. The amplification power $n$ of the non-linear amplifier illustrated therein is equal to or greater than 3. It will, of course, be recognized that, where $n$ is equal to 2, the preferable embodiment is as illustrated in FIG. 2. Thus, in general, and as will be seen, the non-linear amplifier generally illustrated in FIG. 3 admits of a power of amplification equal to $n$ wherein $n$ is an integer greater than 1.

Figure 3:
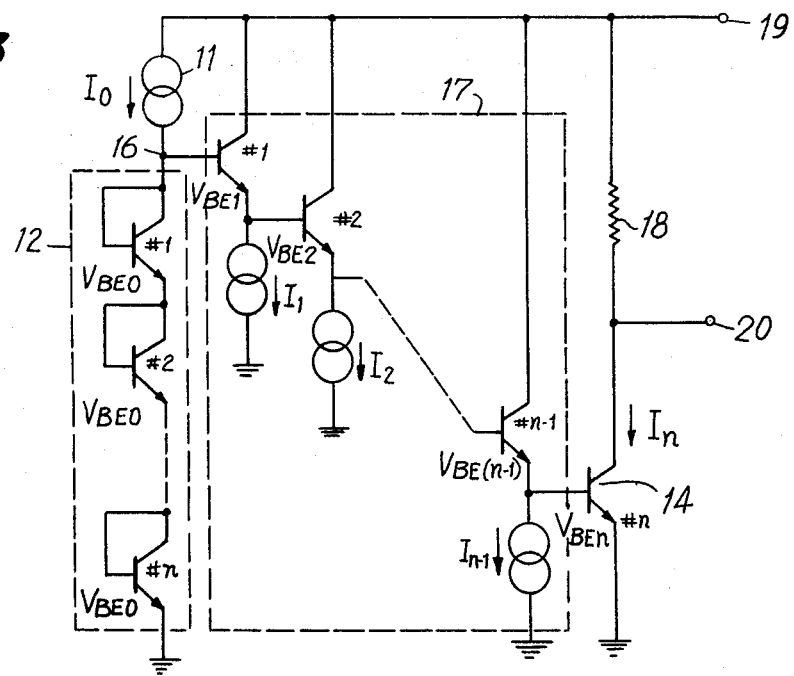
FIG. 3 is a schematic representation of a general non-linear amplifier in accordance with the teachings of the present invention.

The $n$-th power non-linear amplifier of FIG. 3 is substantially similar to the simplified schematic diagram of FIG. 2 in that an amplifying transistor 14 is adapted to receive an input signal current supplied thereto through an emitter-follower stage 17 from a junction 16. The junction 16 is also connected to a series of P-N junctions 12. Moreover, the input signal is supplied to the junction 16 by an input current source 11. More particularly, the emitter-follower stage 17 is comprised of ($n$-1) emitter-follower transistors connected in cascade wherein each emitter-follower transistor includes a constant current source connected in its emitter circuit. For purposes of illustration, the constant current sources are designated $I_1, I_2, \ldots I_{(n-1)}$ for the respective ($n$-1) emitter-follower transistors. The output of the ($n$-1)th emitter-follower transistor is seen to be the output of the emitter-follower stage 17 and is coupled to the base electrode of the amplifying transistor 14.

The series of P-N junctions 12 is here comprised of $n$ P-N junctions, each being formed of a diode-connected transistor.

In mathematically describing the operation of the n-th power non-linear amplifier, it will be assumed that the forward voltage drop across each of the P-N junctions included in the series 12 is designated as $V_{BE0}$, and that the base-emitter voltage drops across the respective emitter-follower transistors included in the emitter-follower stage 17 are designated as $V_{BE1}, V_{BE2} \ldots V_{BE(n-1)}$. The base-emitter voltage drop of the amplifying transistor 14 is designated as $V_{BEn}$. Accordingly, the voltage relationship at junction 16 can be expressed as:

$$n\ V_{BE0} = V_{BE1} + V_{BE2} + \ldots V_{BEn} \tag{15}$$

As was the case with respect to the embodiment illustrated in FIG. 2, the currents flowing through the respective base electrodes of the illustrated transistors are negligible and, therefore, can be neglected. Consequently, the input signal current $I_0$ flowing through the series of P-N junctions 12 as well as the collector-emitter current flowing through each of the emitter-follower transistors included in the emitter-follower stage 17 and the collector-emitter current $I_n$ flowing through the amplifying transistor 14 are given as:

$$I_0 \approx I_S \cdot e^{\ q/kT\ V_{BE0}} = I_S \cdot e^{\alpha V_{BE0}}$$

$$I_1 \approx I_S \cdot e^{\ q/kT\ V_{BE1}} = I_S \cdot e^{\alpha V_{BE1}}$$

$$I_2 \approx I_S \cdot e^{\ q/kT\ V_{BE2}} = I_S \cdot e^{\alpha V_{BE2}}$$

$$\vdots$$

$$I_n \approx I_S \cdot e^{\ q/kT\ V_{BEn}} = I_S \cdot e^{\alpha V_{BEn}} \tag{16}$$

By rearranging the terms of equations (16) the respective voltages can be expressed as:

$$V_{BE0} = \frac{1}{\alpha} \ln \frac{I_0}{I_S}$$

$$V_{BE1} = \frac{1}{\alpha} \ln \frac{I_1}{I_S}$$

$$V_{BE2} = \frac{1}{\alpha} \ln \frac{I_2}{I_S}$$

$$\vdots$$

$$V_{BEn} = \frac{1}{\alpha} \ln \frac{I_n}{I_S} \tag{17}$$

Now, by substituting equations (17) into equation (15) the following is obtained:

$$n \cdot \frac{1}{\alpha} \cdot \ln \frac{I_n}{I_s} = \frac{1}{\alpha} \cdot \ln \frac{I_1}{I_s} +$$

$$\frac{1}{\alpha} \cdot \ln \frac{I_2}{I_s} + \ldots + \frac{1}{\alpha} \cdot \ln \frac{I_n}{I_s} \quad (17A)$$

Solving for the output current $I_n$, the output current is defined as:

$$I_n = \frac{1}{I_1 \cdot I_2 \cdot I_3 \cdot \ldots \cdot I_{(n-1)}} I_o^n \quad (18)$$

It is appreciated that the terms $I_1, I_2, \ldots I_{(n-1)}$ are the respective constant currents produced by the constant current sources connected in the emitter circuits of the respective emitter-follower transistors included in the emitter-follower stage 17. These terms are constant so that the factor $$\frac{1}{I_1 \cdot I_2 \cdot I_3 \cdot \ldots \cdot I_{(n-1)}}$$

is a constant factor. Accordingly, equation (18) represents that the input current $I_o$ is amplified by a power of $n$ to attain the output current $I_n$, and that the output current $I_n$ is proportional to the input current $I_o$ amplified to the $n$-th power. Thus, it is seen that the circuit schematically illustrated in FIG. 3 is operable as an $n$-th power non-linear amplifier.

When considering the junction 16 as illustrated in FIGS. 2 and 3, it is seen that parallel paths comprising plural P-N junctions are provided. The number of P-N junctions included in each parallel path is equal. Thus, in FIG. 2, a first path is formed of the series of P-N junctions 12 and is comprised of 2 P-N junctions, each being formed by the base-emitter junction of a diode-connected transistor. In the other parallel path, a first P-N junction is formed by the base-emitter junction of the emitter-follower transistor 13 included in the emitter-follower stage 17 and a second P-N junction is formed by the base-emitter junction of the amplifying transistor 14. In FIG. 3, the first path is again comprised of the series of P-N junctions and includes n P-N junctions, each being formed by the base-emitter junction of a diode-connected transistor. The other parallel path is seen to comprise (n-1) P-N junction, each being formed of a base-emitter junction included in the emitter-follower stage 17 and the $n$-th base-emitter junction of the amplifying transistor 14. Since the number of P-N junctions included in each parallel path is equal, and is here formed of a base-emitter junction, it should be recognized that voltage variations thereacross that are attributable to temperature variations are cancelled. Consequently, the $n$-th power non-linear amplifier of the present invention is not sensitive to temperature variations. Hence, the input signal is amplified by a power of n and the resultant output signal is not deleteriously affected by temperature changes.

Figure 4:
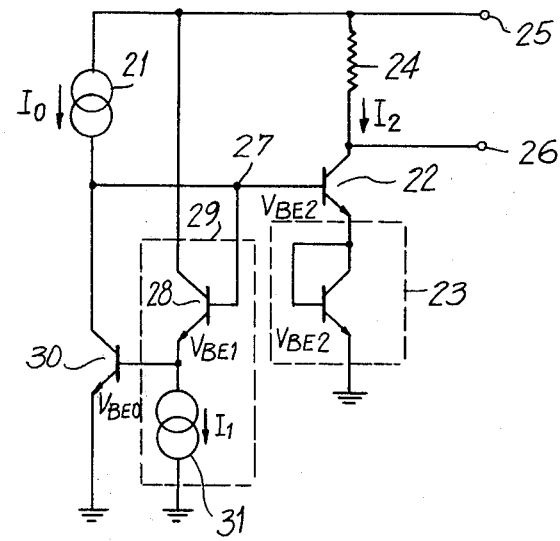
FIG. 4 is a schematic representation of a simplified non-linear amplifier in accordance with the teachings of the present invention wherein the input signal is amplified by a power of 1/2.

Referring now to FIG. 4, there is illustrated a schematic representation of a simplified non-linear amplifier wherein an input signal is amplified by a power of ½. The circuit is comprised of an amplifying transistor 22, a series of P-N junctions 23 and an emitter-follower stage 29. The amplifying transistor 22 is adapted to receive an input signal supplied to the base electrode thereof and to produce an output signal at its collector electrode. Accordingly, the collector electrode of the amplifying transistor is coupled to a source of energizing potential 25 by a load impedance 24, and an output terminal 26 is derived from the collector electrode. The input signal supplied to the amplifying transistor is applied thereto through the input current source 21.

In accordance with the simplified embodiment depicted in FIG. 4, the series of P-N junctions 23 is comprised of a single P-N junction formed of a diode-connected transistor. This series of P-N junctions serves to couple the emitter electrode of the amplifying transistor 22 to a reference potential, such as ground.

A junction 27, through which the input signal is supplied to the base electrode of the amplifying transistor 22, is additionally connected to the emitter-follower stage 29. In the simplified embodiment depicted herein, the emitter-follower stage 29 is comprised of an emitter-follower transistor 28 having a constant current source 31 connected in its emitter circuit. The output of the emitter-follower stage, i.e., the emitter electrode of the emitter-follower transistor 28, is connected to the base electrode of a further transistor 30, the latter having its emitter electrode connected to ground. The collector electrode of the further transistor is directly connected to the aforenoted junction 27.

The respective transistor devices are selected such that the operating characteristics thereof, and in particular, the P-N junction characteristics thereof, are all the same. It is appreciated that this is readily attained in accordance with conventional integrated circuit technology.

The operation of the simplified circuit embodiment depicted in FIG. 4 will now be mathematically described. Let it be assumed that the base-emitter voltage of the further transistor 30 is designated $V_{BE0}$, the base-emitter voltage across the emitter-follower transistor 28 included in the emitter-follower stage 29 is designated as $V_{BE1}$ and that the voltage drop across the P-N junction included in the series of P-N junctions 23 is designated $V_{BE2}$. Additionally, the base-emitter voltage drop of the amplifying transistor 22 is assumed to be equal to the P-N junction voltage drop and, hence, is designated $V_{BE2}$. Therefore, with respect to the junction 27, the following expression represents the voltage relationship thereat:

$$V_{BE0} + V_{BE1} = 2V_{BE2} \quad (19)$$

Now, if the currents flowing through the respective base electrodes of the illustrated transistors are assumed to be negligible, such currents can be omitted from further consideration so that the current $I_o$ flowing through the further transistor 30, the current $I_1$, flowing through the emitter-follower stage 29 and the current $I_2$ flowing through the amplifying transistor 22 and the series P-N junctions 23 can be expressed as:

$$I_o \approx I_S\, e^{q/kT\, V_{BE0}} = I_S\, e^{\alpha V_{BE0}}$$

$$I_1 \approx I_S\, e^{q/kT\, V_{BE1}} = I_S\, e^{\alpha V_{BE1}}$$

$$I_2 \approx I_S\, e^{q/kT\, V_{BE2}} = I_S\, e^{\alpha V_{BE2}} \quad (20)$$

By rearranging terms, the respective voltages expressed in equations (20) are found to be:

$$V_{BE0} = \frac{1}{\alpha} \cdot \ln \frac{I_o}{I_s}$$

$$V_{BE1} = \frac{1}{\alpha} \cdot \ln \frac{I_1}{I_s}$$

$$V_{BE2} = \frac{1}{\alpha} \cdot \ln \frac{I_2}{I_s} \tag{21}$$

The voltages represented in equations (21) can be substituted into equation (19) to obtain:

$$\frac{1}{\alpha} \ln \frac{I_o}{I_s} + \frac{1}{\alpha} \ln \frac{I_1}{I_s} = 2 \frac{1}{\alpha} \ln \frac{I_2}{I_s} \tag{21A}$$

Solving for the output current $I_2$, the output current is represented as:

$$I = I_1^{1/2} \cdot I_o^{1/2} \tag{22}$$

It is appreciated that the term $I_1$ in equation (22) represents the constant current flowing through the emitter-follower stage 29 as produced by the constant current source connected in the emitter circuit of the emitter-follower transistor 28. Accordingly, the term $I_1^{1/2}$ is a constant factor. Hence, as expressed in equation (22), the input current $I_o$ is amplified by a power of ½ to obtain the output current $I_2$. Stated otherwise, the output current is proportional to the input current by the power of ½. Hence, the simplified circuit diagram depicted in FIG. 4 is illustrative of a ½ power non-linear amplifier.

Figure 5:
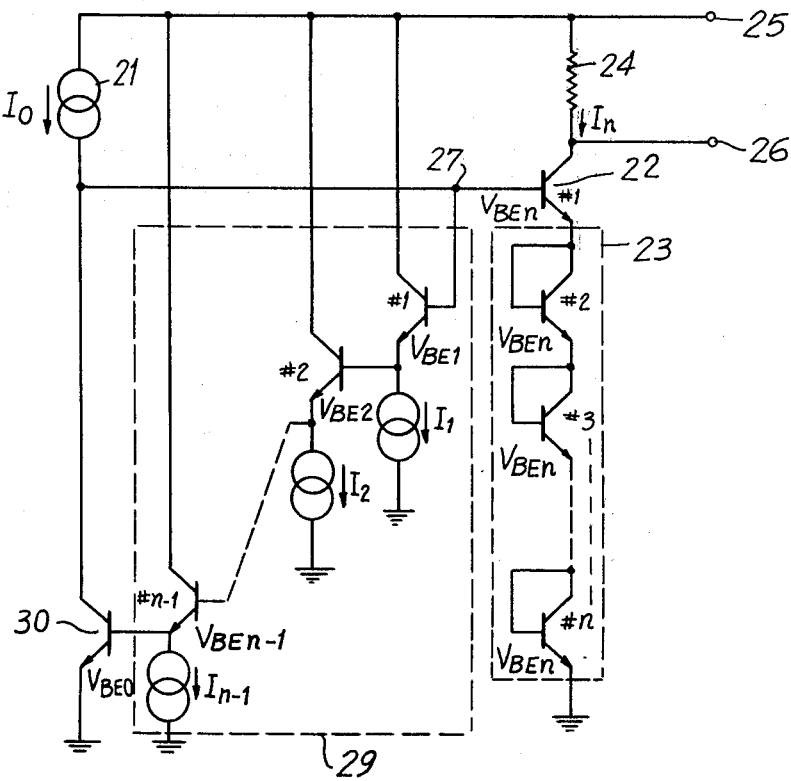
FIG. 5 is a schematic representation of a general non-linear amplifier in accordance with the teachings of the present invention wherein the input signal is amplified by a power of $1/n$.

A generalized $1/n$ power non-linear amplifier will now be described with reference to FIG. 5. The $1/n$ power non-linear amplifier is comprised of an amplifying transistor 22, a series of P-N junctions 23, an emitter-follower stage 29 and a further transistor 30, as aforedescribed with respect to FIG. 4. However, in the general embodiment depicted in FIG. 5, the series of P-N junctions 23 is comprised of ($n$-1) series connected P-N junctions, each comprising a diode-connected transistor such that the P-N junction is formed of the base-emitter junction of each transistor. Similarly, the emitter-follower stage 29 is comprised of ($n$-1) cascaded emitter-follower transistors wherein the base-emitter junctions of the emitter-follower transistors are connected in series. A constant current source is connected in each of the respective emitter circuits of the emitter-follower transistors. As is illustrated, the output of the emitter-follower stage 29, that is, the output of the ($n$-1)th emitter-follower transistor is connected to the base electrode of the further transistor 30, the latter having its base-emitter junction connected to ground.

In accordance with the now well understood mathematical analysis of the illustrated non-linear amplifier, the voltage relationship, taken with respect to junction 27, can be expressed as:

$$V_{BE0} + V_{BE1} + V_{BE2} + \ldots + V_{BE(n-1)} = n V_{BEn} \tag{23}$$

wherein $V_{BE1}, V_{BE2} \ldots V_{BE(n-1)}$ are the base-emitter voltage drops across the respective emitter-follower transistors included in the emitter-follower stage 27; $V_{BE0}$ is the base-emitter voltage of the further transistor 30; and $V_{BEn}$ is the base-emitter voltage of the amplifying transistor 22 or of each of the diode-connected transistors included in the series of P-N junctions 23.

If the negligible currents flowing through the respective transistor bases are omitted, the collector-emitter transistor currents can be expressed as:

$$I_o \approx I_s \cdot e^{(q/kT) \cdot V_{BE0}} = I_s \cdot e^{\alpha \cdot V_{BE0}}$$

$$I_1 \approx I_s \cdot e^{(q/kT) \cdot V_{BE1}} = I_s \cdot e^{\alpha \cdot V_{BE1}}$$

$$I_2 \approx I_s \cdot e^{(q/kT) \cdot V_{BE2}} = I_s \cdot e^{\alpha \cdot V_{BE2}}$$

$$\vdots$$

$$I_{(n-1)} \approx I_s \cdot e^{(q/kT) \cdot V_{BE(n-1)}} = I_s \cdot e^{\alpha \cdot V_{BE(n-1)}}$$

$$I_n \approx I_s \cdot e^{(q/kT) \cdot V_{BEn}} = I_s \cdot e^{\alpha V_{BEn}} \tag{24}$$

wherein the currents $I_1, I_2, \ldots I_{(n-1)}$ are the currents produced by the respective constant current sources connected in the emitter circuits of the emitter-follower transistors included in the emitter-follower stage 29 and the current $I_n$ is the output current flowing through the amplifying transistor 22, and additionally, through the series of P-N junctions 23.

The voltage expressed in equations (24) can be represented as:

$$V_{BE0} = \frac{1}{\alpha} \cdot \ln \frac{I_o}{I_s}$$

$$V_{BE1} = \frac{1}{\alpha} \cdot \ln \frac{I_1}{I_s}$$

$$V_{BE2} = \frac{1}{\alpha} \cdot \ln \frac{I_2}{I_s}$$

$$\vdots$$

$$V_{BE(n-1)} = \frac{1}{\alpha} \cdot \ln \frac{I_{(n-1)}}{I_s}$$

$$V_{BEn} = \frac{1}{\alpha} \cdot \ln \frac{I_n}{I_s} \tag{25}$$

Now, if equations (25) are inserted into the equation (23), the following is obtained:

$$\frac{1}{\alpha} \ln \frac{I_o}{I_s} + \frac{1}{\alpha} \ln \frac{I_1}{I_s} + \frac{1}{\alpha} \ln \frac{I_2}{I_s} + \ldots + \frac{1}{\alpha} \ln \frac{I_{(n-1)}}{I_s} = n \cdot \frac{1}{\alpha} \ln \frac{I_n}{I_s} \tag{25A}$$

By rearranging terms, the output current $I_n$ can be expressed as:

$$I_n = (I_1 \cdot I_2 \cdot \ldots \cdot I_{n-1})^{\frac{1}{n}} \cdot I_o^{\frac{1}{n}} \tag{26}$$

It is appreciated that the factor $(I_1 \cdot I_2 \ldots I_{n-1})^{1/n}$ is dependent solely upon the constant current sources and, therefore, is a constant factor. Accordingly, the output current produced by the non-linear amplifier illustrated in FIG. 5 is proportional to the input current by a power of $1/n$. Stated otherwise, the non-linear amplifier is operable to amplify the input current $I_o$ by a power of $1/n$.

It is appreciated that, in the illustrated embodiment, each base-emitter junction of the emitter-follower transistors included in the emitter-follower stage 29 is a P-N junction. Accordingly, the number of P-N junctions included in the series of P-N junctions 23 is equal to the number of P-N junctions that are connected in cascade in the emitter-follower stage 29. Hence, voltage variations in these P-N junctions that are attributable to temperature changes are cancelled so as to maintain the base-emitter voltage of the amplifying transistor 22 substantially contant. Amplification of a power of $1/n$ is thus achieved regardless of temperature variations. Thus, the illustrative embodiment of FIG. 5 operates as a 1/n power non-linear amplifier that is temperature stable, wherein n is greater than 1.

Figure 6:
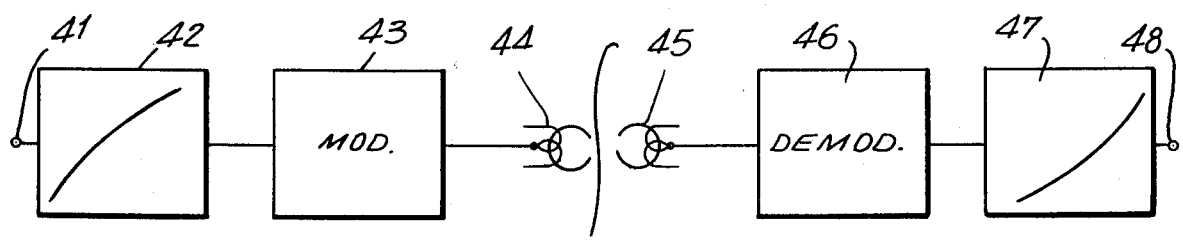
FIG. 6 is a block diagram representing one application wherein the teachings of the present invention are readily utilized.

Referring now to FIG. 6, a block diagram of one typical application of the teachings of the present invention is illustrated. More particularly, FIG. 6 is a block diagram of tape recording apparatus, and in particular, a video tape recorder/reproducer wherein an n-th power power non-linear amplifier and a 1/n-th power non-linear amplifier are used to process information signals. In the illustrated embodiment, a signal recording circuit adapted to record signals on a magnetic medium, such a magnetic tape T, comprises a de-emphasis circuit 42 and a modulator 43. A circuit adapted to repreduce signals from the magnetic medium is comprised of a demodulator 46 and an emphasis circuit 47.

The de-emphasis circuit 42 includes a 1/n-th power non-linear amplifier of the type described hereinabove with respect to FIG. 5, and includes an input coupled to a signal input terminal 41. This non-linear de-emphasis circuit is adapted to compress the signal supplied thereto so that a compressed signal is recoreded on the magnetic medium. After the input signal is compressed to the desired level, the output of the non-linear de-emphasis circuit is supplied to the modulator 43. This modulator comprises a frequency modulator for frequency modulating the compressed signal and for supplying same to a magnetic recording head 44 whereby the compressed, frequency-modulated signal is recorded on the magnetic medium.

In the signal reproducing circuit, a playback magnetic head 45 supplies recorded signals to the demodulator 46. It is appreciated that the demodulator comprises a frequency demodulator circuit adapted to produce a compressed signal at its output that is substantially similar to the signal that had been supplied to the modulator 43. This demodulated, compressed signal is applied to the emphasis circuit 47 which includes the n-th power non-linear amplifier previously described with respect to FIG. 3. The non-linear emphasis circuit is adapted to expand the reproduced signal to a desired level. The expanded signal is derived from the signal output terminal 48 which is coupled to the non-linear emphasis circuit.

Although the non-linear amplifier of the present invention can be readily utilized in various applications, the application thereof to tape recording techniques and, in particular, to a video tape recordiing system permits the recording and reproducing of a signal having a relatively high level without concomitant tape saturation. In addition, the signal processing circuits of such VTR apparatus exhibit relatively stable and reliable operating characteristics and are not temperature sensitive.

It should now be readily apparent that the n-th and the 1/n-th power non-linear amplifiers of the present invention can be easily constructed whereby n can be any desired integer greater than 1. It is seen that the input signal to be amplified is supplied to parallel conducting paths each being comprised of n P-N junctions. In one conducting path, series connected P-N junctions are formed of, for example, diode-connected transistors. In the other conducting path the P-N junctions are formed of cascaded emitter-follower transistors wherein the base-emitter junctions thereof correspond to such P-N junctions. In the n-th power non-linear amplifier embodiment, the amplifying transistor is connected in the conducting path including the emitter-followers whereby the base-emitter junction of the amplifying transistor is included as one of the P-N junctions in that conducting path. In the 1/n-th power non-linear amplifier embodiment, the amplifying transistor is connected in the other conducting path, that is, the conducting path comprised of the series of P-N junctions formed of, for exampled, diode-connected transistors. Nevertheless, it should be appreciated that the total number of P-N junctions included in each conducting path is equal. Thus, it is seen that the exponential factor n can be readily selected merely by selecting the number of P-N junctions to be included in the respective paralled conducting paths. In this manner, the exponential relationship between the input and output signals can be chosen. The exponential curve representing the amplification of the non-linear amplifier can thus be easily selected.

It is readily appreciated that the various embodiments of the non-linear amplifier, as shown and described hereinabove, include merely a single resistive element, i.e., the amplifying transistor load resistor. Accordingly, the non-linear amplifier of the present invention is readily adapted to integrated circuit fabrication techniques.

While the present invention has been particularly shown and described with reference to a plurality of preferred embodiments thereof, it will be obvious to those skilled in the art that various changes and modifications in form and details may be made without departing from the spirit and scope of the invention. It is therefore intended that the appended claims be interpreted as including all such changes and modifications.

What is claimed is:

1. A non-linear amplifier, comprising an amplifying transistor; an input terminal; an input current source for supplying an input current to said input terminal; a series of n P-N junctions driven by said input current source for providing a predetermined bias voltage for said amplifying transistor; and (n-1) emitter follower transistors connected in cascade from said input terminal to said amplifying transistor, said amplifying transistor having its base-emitter junction connected in cascade with the base-emitter junctions of said cascade-connected emitter follower transistors for obtaining from said amplifying transistor an output current corresponding to the n-th power of said input current.

2. A non-linear amplifier according to claim 1; in which said series of n P-N junctions and said (n-1) cascade connected emitter follower transistors are connected in parallel with respect to said input terminal.

3. A non-linear amplifier according to claim 2; in which said n P-N junctions are constituted by the base-emitter junctions of n diode-connected transistors.

4. A non-linear amplifier according to claim 1; in which a constant current source is connected in the emitter circuit of each of said (n-1) emitter follower transistors.

* * * * *